(12) United States Patent
Kim (10) Patent No.: US 7,313,036 B2
(45) Date of Patent: Dec. 25, 2007

(54) MEMORY DEVICE HAVING OPEN BIT LINE ARCHITECTURE FOR IMPROVING REPAIRABILITY AND METHOD OF REPAIRING THE SAME

(75) Inventor: Dong Min Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/260,760

(22) Filed: Oct. 27, 2005

(65) Prior Publication Data
US 2006/0181943 A1     Aug. 17, 2006

(30) Foreign Application Priority Data
Feb. 15, 2005    (KR)  ..................... 10-2005-0012280

(51) Int. Cl.
*G11C 7/00*     (2006.01)
(52) U.S. Cl. .................. 365/200; 365/210; 365/230.03; 365/63
(58) Field of Classification Search ................ 365/200, 365/210, 230.03, 63
See application file for complete search history.

(56) References Cited

U.S. PATENT DOCUMENTS

| | | | |
|---|---|---|---|
| 5,608,668 A | 3/1997 | Zagar et al. | ................. 365/149 |
| 5,757,710 A | 5/1998 | Li et al. | ...................... 365/205 |
| 6,043,560 A * | 3/2000 | Haley et al. | ................. 257/706 |
| 6,535,439 B2 * | 3/2003 | Cowles | ........................ 365/201 |
| 6,603,688 B2 * | 8/2003 | Hasegawa et al. | .......... 365/200 |
| 6,639,822 B2 * | 10/2003 | Fujisawa et al. | .............. 365/63 |

FOREIGN PATENT DOCUMENTS

| KR | 10-0161729 | 8/1998 |
|---|---|---|
| KR | 10-2000-0051869 | 8/2000 |

* cited by examiner

*Primary Examiner*—Huan Hoang
(74) *Attorney, Agent, or Firm*—Mills & Onello LLP (57) ABSTRACT

In a memory device having an open bit line architecture for improving repairability and a method of repairing the memory device, redundant memory cells used to repair defective cells are included even in first and second edge sub-arrays that are arranged at the edges of a memory array. Further, memory cells connected to some of the bit lines in a normal sub-array can be replaced with redundant memory cells included in the first edge sub-array, and memory cells connected to the remaining bit lines can be replaced with redundant memory cells included in the second edge sub-array. Therefore, in the memory device having an open bit line architecture according to the present invention, if all of the redundant memory cells included in normal sub-arrays have been exhausted through replacement, defective cells can be repaired using the redundant memory cells included in the edge sub-arrays. Therefore, the memory device and method of repairing the memory device according to the present invention are advantageous in that they can remarkably improve repairability.

10 Claims, 8 Drawing Sheets

MEMORY DEVICE HAVING OPEN BIT LINE ARCHITECTURE FOR IMPROVING REPAIRABILITY AND METHOD OF REPAIRING THE SAME

CROSS-REFERENCE TO RELATED APPLICATIONS

This U.S. non-provisional patent application claims priority under 35 U.S.C. § 119 to Korean Patent Application 10-2005-12280 filed on Feb. 15, 2005, the entire contents of which are hereby incorporated by reference.

BACKGROUND OF THE INVENTION

1. Field of the Invention

The present invention relates, in general, to memory devices and, more particularly, to a memory device having an open bit line architecture and a method of repairing the memory device.

2. Description of the Related Art

In a memory device having an open bit line architecture, sense amplifiers are commonly disposed between sub-arrays. Each sense amplifier is connected to two bit lines. The bit lines are connected to memory cells included in different adjacent sub-arrays. Further, in the memory device having an open bit line architecture, an edge sub-array, that is, a sub-array that is positioned on the edge, or perimeter, of the array, has dummy bit lines that are interleaved with normal bit lines. Memory cells connected to the dummy bit lines do not store data during normal operation.

In the meantime, with ever-increasing integration and capacity requirements for memory devices, the size of memory chips tends to increase. The increase in the size of memory chips is a direct factor that results in a decrease in wafer yield. One of methods of improving wafer yield is repair technology under which redundant memory cells are provided in a memory device and cells that are determined to be defective are replaced with the redundant memory cells.

Figure 1:
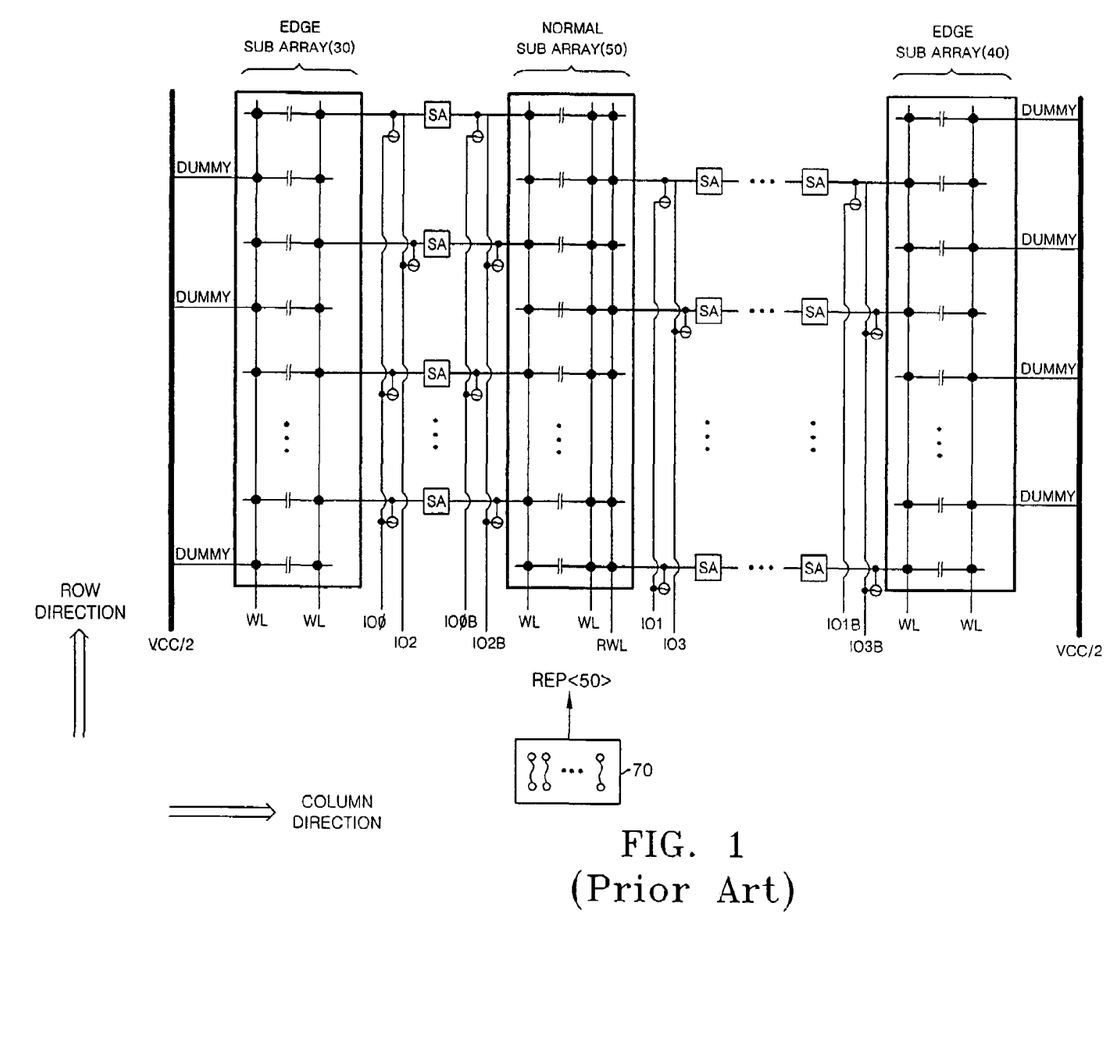
FIG. 1 is a diagram showing a conventional memory device having an open bit line architecture.

In a conventional memory device having an open bit line architecture shown in FIG. 1, a normal (non-edge) sub-array 50 positioned in a non-edge region includes redundant word lines RWL, and redundant memory cells connected to the redundant word lines. Further, if defective cells are present among the memory cells, the defective cells are replaced with the redundant memory cells using a method of cutting fuses in a repair control unit 70, etc.

However, in edge sub-arrays 30 and 40, redundant word lines and redundant memory cells are not provided. Therefore, if the redundant memory cells in the normal sub-array 50 are exhausted through replacement, no additional defective cells can be repaired. Accordingly, in the conventional memory device having an open bit line architecture of FIG. 1 repairability is limited.

SUMMARY OF THE INVENTION

Accordingly, the present invention is directed to a memory device having improved repair capability, and a method of repairing a memory device.

In one aspect, the present invention is directed to a memory device having an open bit line architecture. The memory device comprises first and second edge sub-arrays, and at least one normal sub-array. In the first and second edge sub-arrays, normal bit lines and dummy bit lines are interleaved, the normal bit lines being connected to memory cells that store data during normal operation, the dummy bit lines being connected to memory cells that do not store data during normal operation. The first and second edge sub-arrays include redundant word lines and redundant memory cells connected to the redundant word lines. The normal sub-array is arranged between the first and second edge sub-arrays. In the normal sub-array, normal bit lines connected to a first sense amplifier area and normal bit lines connected to a second sense amplifier area are interleaved with each other. The first sense amplifier area is arranged on a first side of the normal sub-array, while the second sense amplifier area is arranged on a second side of the normal sub-array. The normal sub-array is implemented so that memory cells connected to the normal bit lines connected to the first sense amplifier area may be replaced with the redundant memory cells included in the first edge sub-array, and memory cells connected to the normal bit lines connected to the second sense amplifier area may be replaced with the redundant memory cells included in the second edge sub-array.

In one embodiment, the memory device further comprises a plurality of sense amplifiers, wherein two normal bit lines adjacent to each dummy bit line of the edge sub-arrays are connected to sense amplifiers connected to different data lines.

In another embodiment, the memory device further comprises a plurality of sense amplifiers, wherein two bit lines, which are adjacent to each bit line connected to the first sense amplifier area and which are connected to the second sense amplifier area, are connected to sense amplifiers connected to different data lines.

In another embodiment, the normal sub-array includes redundant memory cells that can replace memory cells included in the normal sub-array.

In another embodiment, the memory device further comprises a repair control unit that generates a predetermined repair signal, which performs a control operation so that a redundant word line of the edge sub-arrays is selected to replace a word line of the normal sub-array.

In another aspect, the present invention is directed to a memory device having an open bit line architecture. The device comprises at least one edge sub-array in which normal bit lines and dummy bit lines are interleaved with each other, the normal bit lines being connected to memory cells that store data during normal operation, the dummy bit lines being connected to memory cells that do not store data during normal operation, the edge sub-array including redundant word lines and redundant memory cells connected to the redundant word lines. At least one normal sub-array includes a plurality of normal bit lines, wherein memory cells connected to the normal bit lines of the normal sub-array may be replaced with the redundant memory cells included in the edge sub-array.

In one embodiment, the normal sub-array includes redundant memory cells that can replace memory cells included in the normal sub-array.

In another embodiment, the memory device further comprises a repair control unit for generating a predetermined repair signal, which performs a control operation so that a redundant word line of the edge sub-array is selected to replace a word line of the normal sub-array.

In another aspect, the present invention is directed to a method of repairing a memory device having an open bit line architecture. In the repair method, a repair control unit activates a repair signal. In response to the repair signal, memory cells, connected to normal bit lines connected to a first sense amplifier area that is arranged on a first side of a normal sub-array, are replaced with memory cells included in a first edge sub-array, and memory cells, connected to normal bit lines connected to a second sense amplifier area that is arranged on a second side of the normal sub-array, are replaced with memory cells included in a second edge sub-array. The first and second edge sub-arrays are arranged at both edges of a memory array of the memory device, and the normal sub-array is arranged between the first and second edge sub-arrays.

In another aspect, the present invention is directed to a method of repairing a memory device having an open bit line architecture. A repair signal is generated at a repair control unit. In response to the repair signal, memory cells included in a normal sub-array are replaced with memory cells included in an edge sub-array, the edge sub-array being arranged at an edge of a memory array of the memory device, the normal sub-array being arranged in a non-edge region of the memory array of the memory device.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS OF THE INVENTION

Hereinafter, embodiments of the present invention will be described in detail with reference to the attached drawings.

Reference is now made to the drawings, in which the same reference numerals are used throughout the different drawings to designate the same or similar components.

Figure 2:
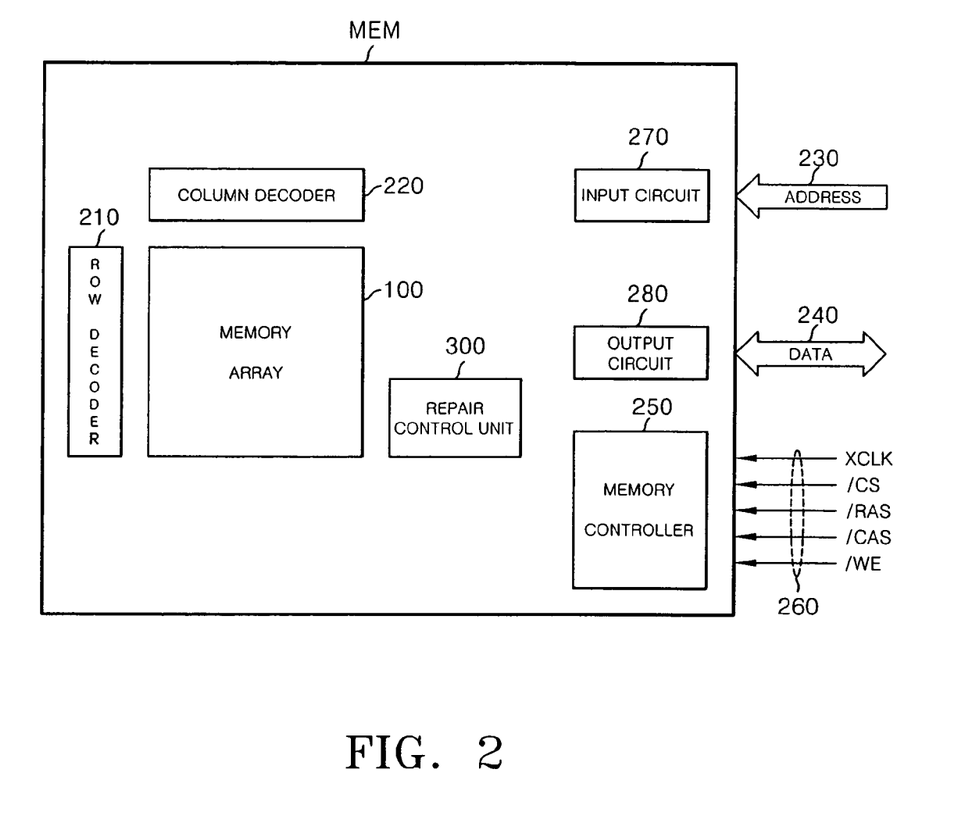
FIG. 2 is a diagram schematically showing a memory device having an open bit line architecture according to an embodiment of the present invention.

FIG. 2 is a diagram schematically showing a memory device MEM having an open bit line architecture according to an embodiment of the present invention. The memory device MEM includes a memory array 100. In the embodiment of FIG. 2, the memory array 100 includes a plurality of memory cells arranged in rows and columns. A row decoder 210 and a column decoder 220 access rows and columns, respectively, corresponding to addresses provided through a plurality of address lines, that is, address buses 230. Data are transmitted to and received from the memory device MEM through data lines, that is, data buses 240. A memory controller 250 performs control operations so that an external system can transmit data to and receive data from the memory array 100. In this case, the transmission/reception of data is performed by an input circuit 270 and an output circuit 280 in response to input signals on control lines 260. Further, the memory controller 250 receives control signals through the lines 260, and determines operation modes, such as a read or write mode. The input signals, input through the lines 260, include an external clock XCLK, a row address strobe /RAS, a column address strobe /CAS, a write enable signal /WE, etc., but the input signals are not limited to these signals, and can include other signals, as required by the memory device.

The memory device MEM also includes a repair control unit 300. Defective cells in the memory array 100 are replaced with redundant memory cells using a method of cutting fuses included in the repair control unit 300.

The memory device MEM of FIG. 2 may take the form of one of a number of different memory devices, such as Dynamic Random Access Memory (DRAM), Static RAM (SRAM), or flash memory. Further, DRAM can comprise, for example, synchronous DRAM such as Synchronous Graphics RAM (SGRAM), Synchronous DRAM (SDRAM) or SGRAM II, Double Data Rate (DDR) SDRAM, Synclink DRAM or Rambus DRAM. The memory device MEM of FIG. 2 is simplified to show a single embodiment of the memory device of the present invention. Those skilled in the art will appreciate that not all characteristics of the memory device are shown in detail.

Figure 3:
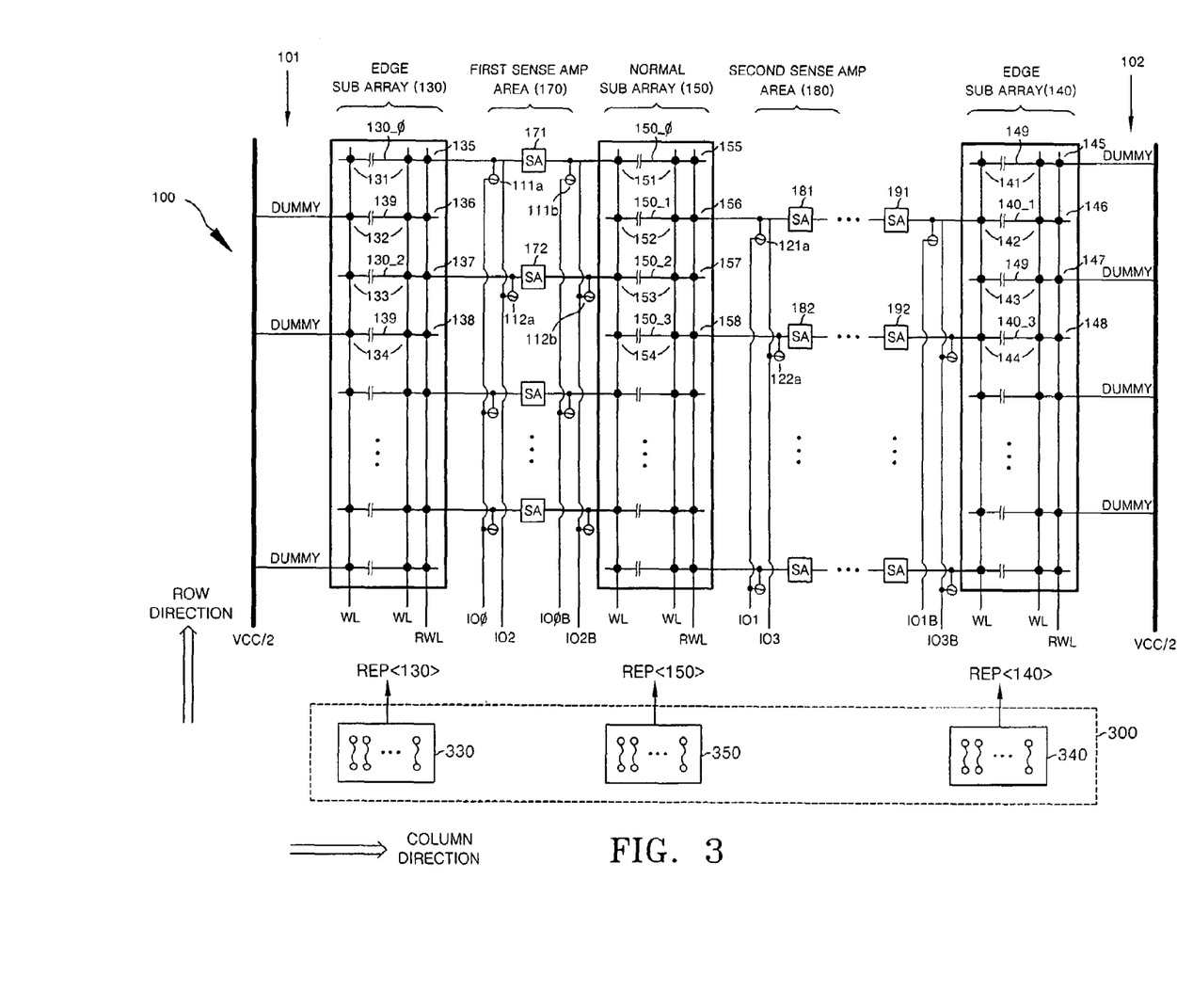
FIG. 3 is a diagram showing a portion of a memory array that can be repaired by a repair control unit of FIG. 2.

FIG. 3 is a diagram showing a portion of the memory array 100 that can be repaired by the repair control unit 300 of FIG. 2. As shown in FIG. 3, the memory array 100 includes a plurality of normal sub-arrays 150 arranged in a central, or non-edge, region of the array, and edge sub-arrays 130 and 140 that are arranged on an outer perimeter, or edge, of the array. For simplification of the drawing, only a single normal sub-array 150 is shown in FIG. 3. The sub-arrays 130, 140 and 150 are arranged in a horizontal direction in FIG. 3 between a first edge 101 and a second edge 102. The edge sub-arrays 130 and 140 are arranged at left-most and right-most positions of the array between the first edge 101 and the second edge 102. The normal sub-arrays 150 are arranged between the edge sub-arrays 130 and 140. In the embodiment of FIG. 3, the memory array 100 is simplified, so that only normal (center) sub-arrays 150 and edge sub-arrays 130 and 140, arranged in one direction, are shown. However, in another embodiment, the memory array 100 may be implemented so that a plurality of edge sub-arrays is arranged between the first and second edges 101 and 102. In such an embodiment, the total number of edge sub-arrays is greater than 2.

The memory array 100 includes a plurality of memory cells, which are indicated by large dots in FIG. 3. The memory cells are disposed at intersections of rows and columns. Further, memory cells in the same column are connected to the same bit lines BIT and /BIT. Memory cells in the same row are connected to the same word lines WL or redundant word lines RWL. The bit lines are interleaved, and an activated word line WL or redundant word line RWL traverses memory cells placed on bit lines BIT and /BIT. Memory cells 131, 133, 151 to 154, 142 and 144 are normal memory cells. That is, the memory cells 131, 133, 151 to 154, 142 and 144 are used for the operation of the memory array 100 for storing data bits.

Memory cells 135, 137, 155 to 158, 146 and 148 are redundant memory cells. That is, the memory cells 135, 137, 155 to 158, 146 and 148 can also store data bits, and can be used to replace the normal memory cells, if the normal memory cells are non-operational.

The memory cells 132, 134, 136, 138, 141, 143, 145 and 147 are dummy memory cells. The memory cells 132, 134, 136, 138, 141, 143, 145 and 147 do not store data during normal operation.

The memory array 100 includes a plurality of sense amplifiers and a plurality of bit lines. Bit lines 130_0, 130_2, 150_0 to 150_3, 140_1 and 140_3 are normal bit lines. The bit lines 130_0, 130_2, 150_0 to 150_3, 140_1 and 140_3 connect the normal memory cells 131, 133, 151 to 154, 142 and 144 and the redundant memory cells 135, 137, 155 to 158, 146 and 148 to sense amplifiers 171, 172, 181, 182, 191 and 192 arranged between neighboring arrays of the sub-arrays 130, 150 and 140. Bit lines 139 and 149 are dummy bit lines. The bit lines 139 and 149 are connected to a fixed voltage (typically, VCC/2).

The memory array 100 of FIG. 3 has an open bit line architecture in which bit lines are interleaved. That is, two adjacent bit lines in the same sub-array are connected to sense amplifiers arranged on both sides of the sub-array. For example, the bit line 150_0 of the sub-array 150 is connected to the sense amplifier 171 placed in a first sense amplifier area 170. The bit line 150_1 adjacent to the bit line 150_0 in the same sub-array 150 is connected to another sense amplifier 181 placed in a second sense amplifier area 180. Similarly, in the edge sub-arrays 130, 140 dummy bit lines 139 and 149 are also interleaved with the normal bit lines 130_0, 130_2, 140_1 and 140_3. That is, the dummy bit lines 139 and 149 are adjacent to two normal bit lines 130_0, 130_2, and 140_1, 140_3, respectively. The normal bit lines 130_0, 130_2, and 140_1, 140_3 are adjacent to the two dummy bit lines, respectively.

Meanwhile, the repair control unit 300 includes fuse boxes 330, 350 and 340 corresponding to the sub-arrays 130, 150 and 140, respectively. Fuses at corresponding addresses in the fuse boxes 330, 350 and 340 are cut to replace the defective cells of the memory array 100 with redundant memory cells. As a result, the defective cells can be repaired.

Figure 4:
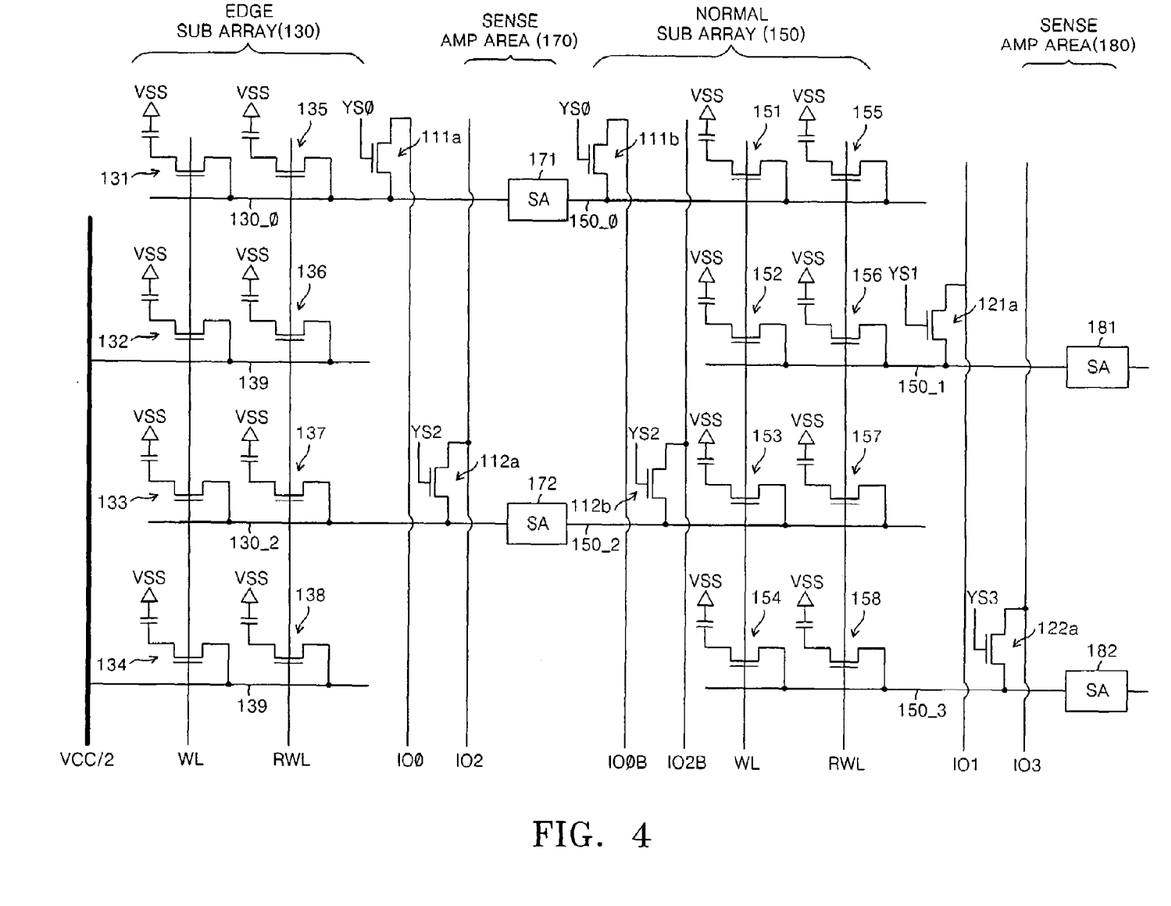
FIG. 4 is a detailed diagram showing a portion of the memory array of FIG. 3.

FIG. 4 is a detailed diagram showing a portion of the memory array 100 of FIG. 3. The bit line 130_0 is connected to a data line IO0 through a column selection switch 111a responding to a column selection signal YS0. The bit line 130_2 is connected to a data line IO2 through a column selection switch 112a responding to a column selection signal YS2.

The bit line 150_0 is connected to a data line IO0B through a column selection switch 111b responding to the column selection signal YS0. The bit line 150_2 is connected to a data line IO2B through a column selection switch 112b responding to the column selection signal YS2.

The bit line 150_1 is connected to a data line IO1 through a column selection switch 121a responding to a column selection signal YS1. The bit line 150_3 is connected to a data line IO3 through a column selection switch 122a responding to a column selection signal YS3.

The data lines IO0 and IO0B, IO1 and IO1B, IO2 and IO2B, and IO3 and IO3B are lines for receiving and outputting data, and are specified by different addresses.

Figure 5:
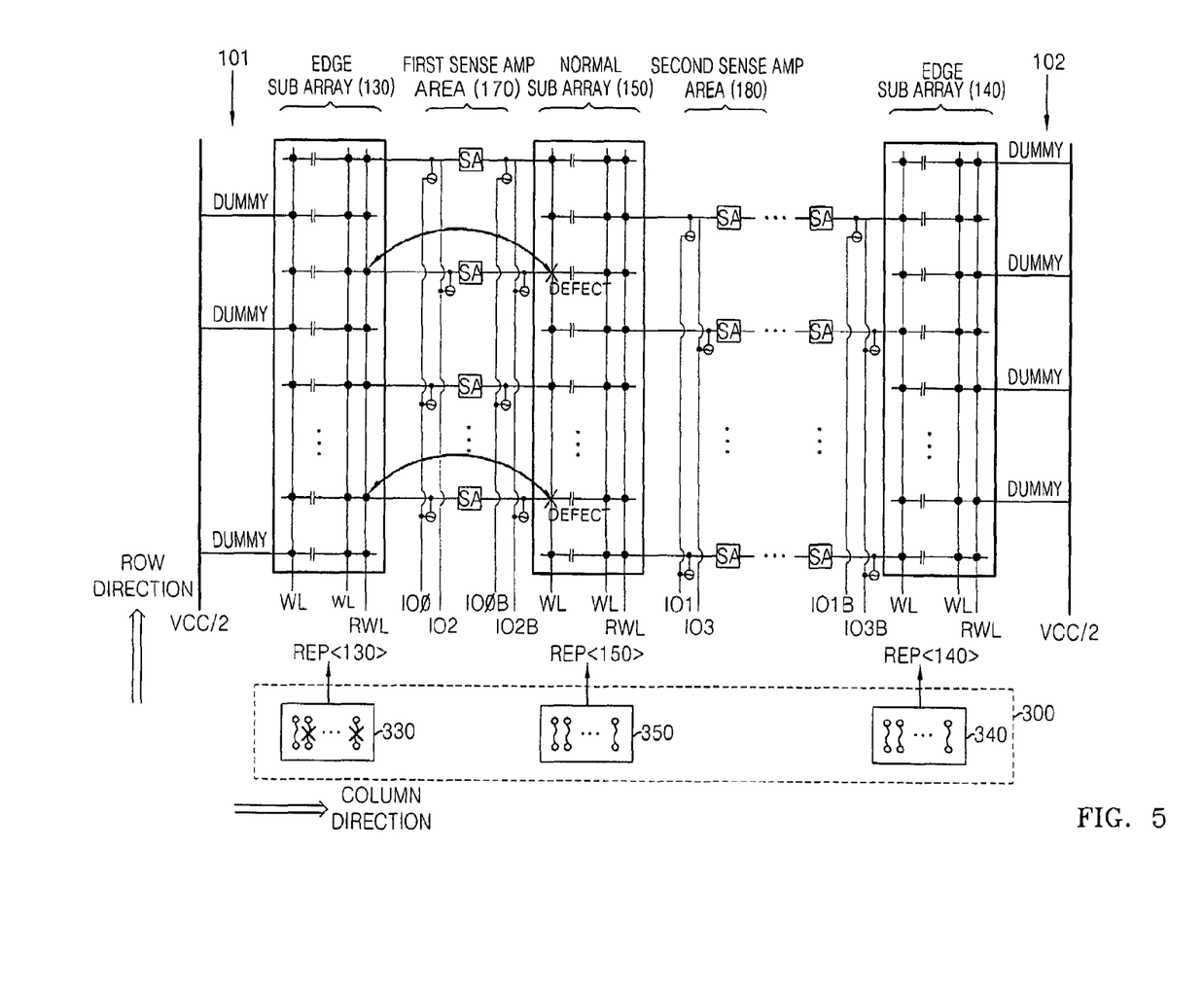
FIGS. 5 to 7 are views showing a method of repairing defective cells in the memory device of the present invention.
Figure 6:
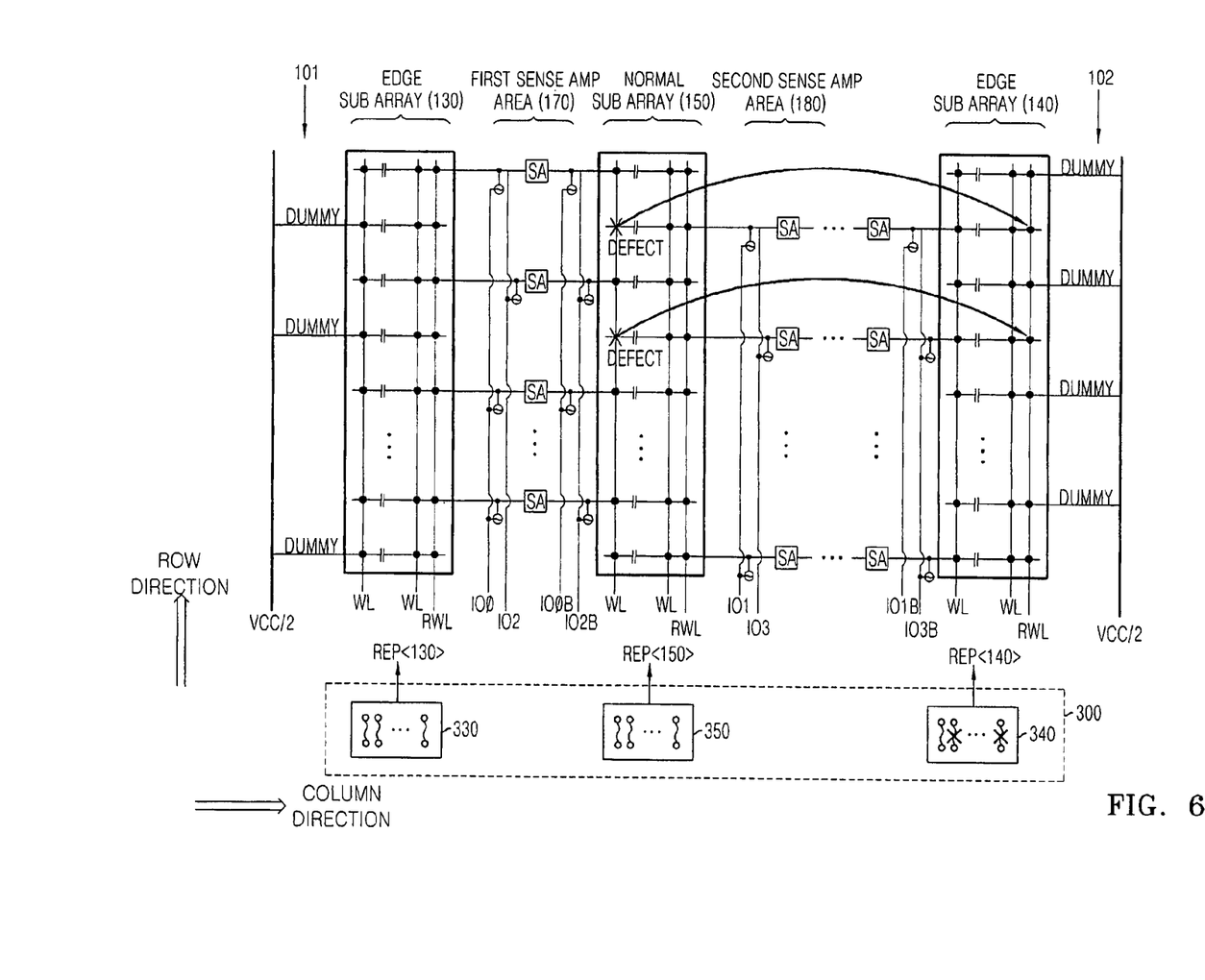
Figure 7:
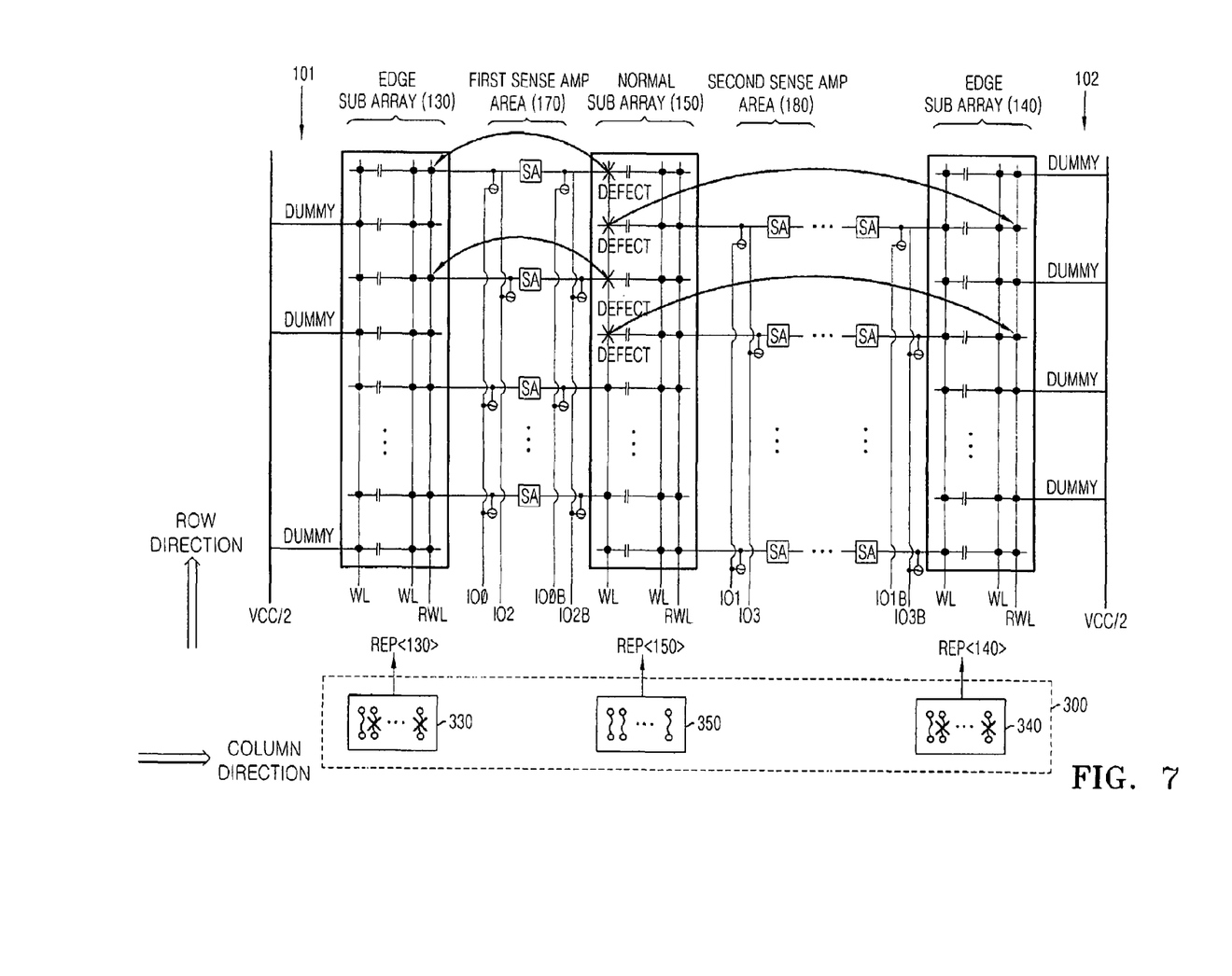

FIGS. 5, 6 and 7 illustrate a method of repairing defective cells in the memory device of the present invention.

Defective cells connected to the data lines IO0 and IO0B or data lines IO2 and IO2B can be repaired according to the method shown in FIG. 5. In this case, fuses at addresses corresponding to the defective cells are cut in the fuse box 330 of the repair control unit 300 corresponding to the first edge sub-array 130, and then a repair control signal REP <130> is generated. Further, the defective cells are replaced with the redundant memory cells of the first edge sub-array 130 in response to the repair control signal REP <130>.

Defective cells connected to the data lines IO0 and IO0B or IO3 and IO3B can be repaired according to the method shown in FIG. 6. In this case, fuses at addresses corresponding to the defective cells are cut in the fuse box 340 of the repair control unit 300 corresponding to the second edge sub-array 140, and then a repair control signal REP <140> is generated. Further, the defective cells are replaced with the redundant memory cells of the second edge sub-array 140 in response to the repair control signal REP <140>.

As shown in FIG. 7, if all of the memory cells corresponding to one row are defective due to a defect in a word line itself, etc., the fuses corresponding to the row are individually cut in the fuse boxes 330 and 340, so that the defective cells can be repaired. That is, memory cells connected to the data lines IO0 and IO0B and IO2 and IO2B are replaced with the redundant memory cells included in the first edge sub-array 130, while memory cells connected to the data lines IO1 and IO1B and IO3 and IO3B are replaced with the redundant memory cells included in the second edge sub-array 140.

Figure 8:
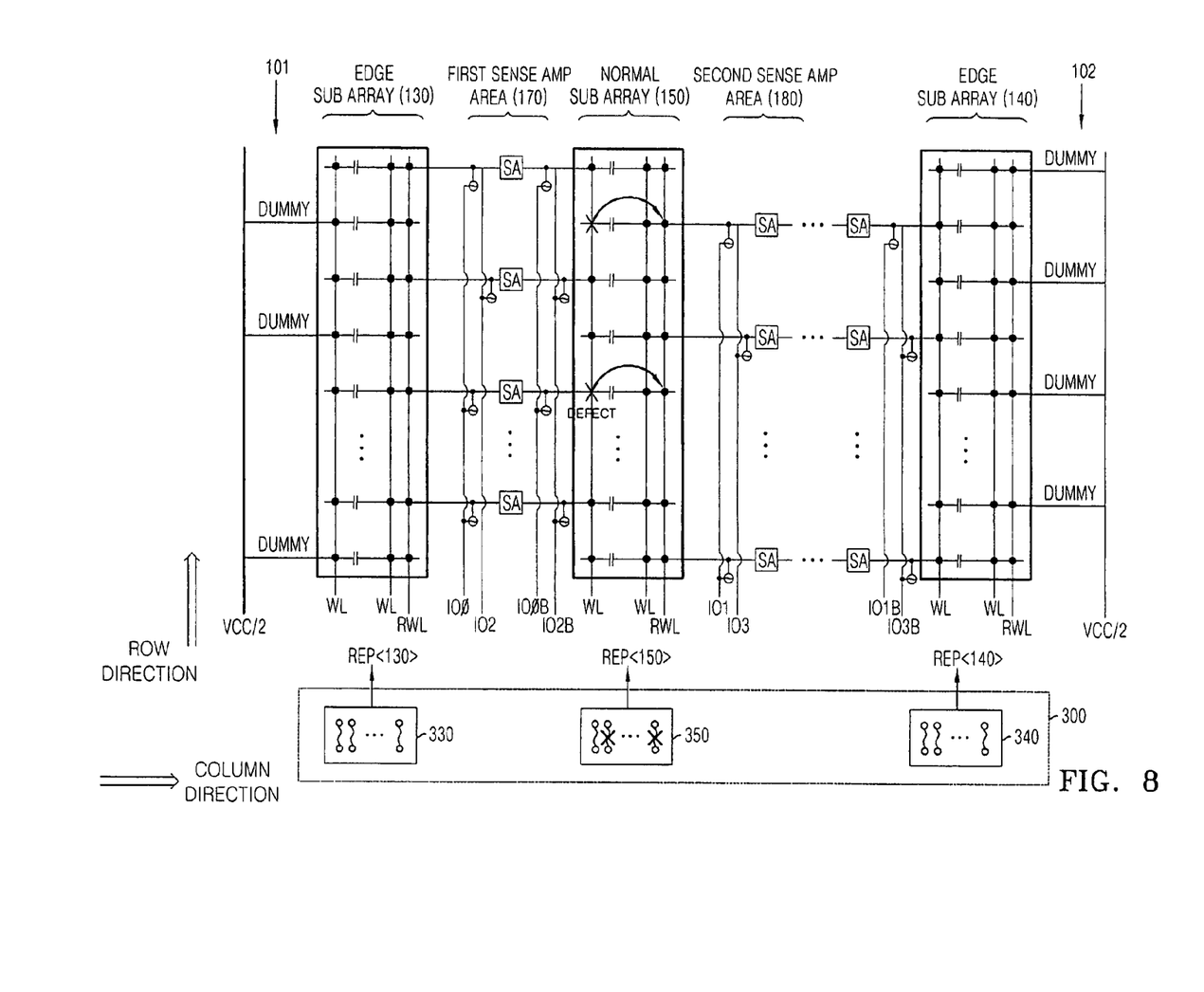
FIG. 8 is a view showing a method of repairing defective cells in the memory device of the present invention.

In the memory device of the present invention, it is apparent that the normal sub-array 150 can also include redundant memory cells to allow defective cells of the normal sub-array 150 itself to be replaced with the redundant cells, as shown in FIG. 8.

As described above, the present invention provides a memory device having an open bit line architecture and a method of repairing the memory device, in which first and second edge sub-arrays arranged at the edges of a memory array include redundant memory cells that can be used to repair defective cells. Further, memory cells connected to some of the bit lines of normal sub-arrays can be replaced with redundant memory cells included in the first edge sub-array. Memory cells connected to the remaining bit lines can be replaced with redundant memory cells included in the second edge sub-array. Therefore, in the memory device having an open bit line architecture according to the present invention, if all of the redundant memory cells included in normal sub-arrays have been exhausted through replacement, defective cells can be still be repaired using the redundant memory cells included in the edge sub-arrays. Therefore, the memory device and method of repairing the memory device according to the present invention are advantageous in that they can remarkably improve repairability.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A memory device having an open bit line architecture, comprising:
   first and second edge sub-arrays in which normal bit lines and dummy bit lines are interleaved, the normal bit lines being connected to memory cells that store data during normal operation, the dummy bit lines being connected to memory cells that do not store data during normal operation, the first and second edge sub-arrays including redundant word lines and redundant memory cells connected to the redundant word lines; and
   at least one normal sub-array which is arranged between the first and second edge sub-arrays, and in which normal bit lines connected to a first sense amplifier area and normal bit lines connected to a second sense amplifier area are interleaved with each other, the first sense amplifier area being arranged on a first side of the normal sub-array, the second sense amplifier area being arranged on a second side of the normal sub-array, wherein the normal sub-array is implemented so that memory cells connected to the normal bit lines connected to the first sense amplifier area are replaced with the redundant memory cells that are connected to the redundant word lines and that are included in the first edge sub-array by controlling an open or closed state of first fuses corresponding to addresses of the replaced memory cells connected to the normal bit lines connected to the first sense amplifier area, and memory cells connected to the normal bit lines connected to the second sense amplifier area are replaced with the redundant memory cells that are connected to the redundant word lines and that are included in the second edge sub-array by controlling an open or closed state of second fuses corresponding to addresses of the replaced memory cells connected to the normal bit lines connected to the second sense amplifier area, wherein the open or closed state of the first and second fuses are controlled at a repair control unit that corresponds to the first and second edge sub-arrays.

2. The memory device according to claim 1, further comprising a plurality of sense amplifiers, wherein two normal bit lines adjacent to each dummy bit line of the edge sub-arrays are connected to sense amplifiers connected to different data lines.

3. The memory device according to claim 1, further comprising a plurality of sense amplifiers, wherein two bit lines, which are adjacent to each bit line connected to the first sense amplifier area and which are connected to the second sense amplifier area, are connected to sense amplifiers connected to different data lines.

4. The memory device according to claim 1, wherein the normal sub-array includes redundant memory cells that replace memory cells included in the normal sub-array.

5. The memory device according to claim 1, further comprising the repair control unit that generates a predetermined repair signal, which performs a control operation so that a redundant word line of the edge sub-arrays is selected to replace a word line of the normal sub-array.

6. A memory device having an open bit line architecture, comprising:
   at least one edge sub-array in which normal bit lines and dummy bit lines are interleaved with each other, the normal bit lines being connected to memory cells that store data during normal operation, the dummy bit lines being connected to memory cells that do not store data during normal operation, the edge sub-array including redundant word lines and redundant memory cells connected to the redundant word lines; and
   at least one normal subarray including a plurality of normal bit lines,
   wherein memory cells connected to the normal bit lines of the normal sub-array are replaced with the redundant memory cells that are connected to the redundant word lines and that are included in the edge sub-array by controlling an open or closed state of fuses corresponding to addresses of the replaced memory cells connected to the normal bit lines, wherein the open or closed state of the fuses are controlled at a repair control unit that corresponds to the edge sub-array.

7. The memory device according to claim 6, wherein the normal sub-array includes redundant memory cells that replace memory cells included in the normal sub-array.

8. The memory device according to claim 6, further comprising the repair control unit that generates a predetermined repair signal, which performs a control operation so that a redundant word line of the edge sub-array is selected to replace a word line of the normal sub-array.

9. A method of repairing a memory device having an open bit line architecture, comprising the steps of:
   generating a repair signal at a repair control unit; and
   in response to the repair signal, replacing memory cells, connected to normal bit lines connected to a first sense amplifier area that is arranged on a first side of a normal sub-array, with redundant memory cells included in a first edge sub-array, and connected to a redundant word line in the first edge sub-array, by controlling an open or closed state of first fuses corresponding to addresses of the replaced memory cells connected to the normal bit lines connected to the first sense amplifier area, and replacing memory cells, connected to normal bit lines connected to a second sense amplifier area that is arranged on a second side of the normal sub-array, with redundant memory cells in a second edge sub-array, and connected to a redundant word line in the second edge sub-array, by controlling an open or closed state of second fuses corresponding to addresses of the replaced memory cells connected to the normal bit lines connected to the second sense amplifier area, the first and second edge sub-arrays being arranged at both edges of a memory array of the memory device, the normal sub-array being arranged between the first and second edge sub-arrays, wherein the open or closed state of the first and second fuses are controlled at the repair control unit that corresponds to the first and second edge sub-arrays.

10. A method of repairing a memory device having an open bit line architecture, comprising the steps of:
   generating a repair signal at a repair control unit; and
   replacing, in response to the repair signal, memory cells included in a normal sub-array with redundant memory cells that are connected to a redundant word line and that are included in an edge sub-array by controlling an open or closed state of fuses corresponding to addresses of the replaced memory cells connected to the normal bit lines, wherein the open or closed state of the fuses are controlled at the repair control unit that corresponds to the edge sub-array, the edge sub-array being arranged at an edge of a memory array of the memory device, the normal sub-array being arranged in a non-edge region of the memory array of the memory device.

\* \* \* \* \*